Feb. 23, 1965 R. G. DENKEWALTER ETAL 3,171,068

SEMICONDUCTOR DIODES

Filed Oct. 19, 1960

Robert G. Denkewalter,
Donald J. Shombert,
*INVENTORS.*
*BY.*

Walter Katz

*ATTORNEY.*

United States Patent Office 3,171,068
Patented Feb. 23, 1965

3,171,068
SEMICONDUCTOR DIODES
Robert G. Denkewalter, Westfield, and Donald J. Shembert, North Plainfield, N.J., assignors to Merck & Co., Inc., Rahway, N.J., a corporation of New Jersey
Filed Oct. 19, 1960, Ser. No. 63,531
3 Claims. (Cl. 317—234)

This invention relates to semiconductor devices and more particularly to semiconductor diodes capable of conducting large amounts of current and of providing large capacitance.

Semiconductor diodes, particularly those of the junction type, have been eminently successful in the prior art as rectifiers and have in many applications been utilized as voltage variable capacitors. Such diodes, however, are exceedingly limited in the amount of current which may be conducted through them in the forward direction. This current limitation is a result primarily of the junction area which is available within the body of the semiconductor wafer. Similarly, the amount of capacitance which is capable of being exhibited by a particular semiconductor diode is determined primarily by the junction area present within the semiconductor wafer. Prior art attempts at forming semiconductor wafers having exceedingly large junction areas have been relatively unsuccessful. This lack of success has in part been attributed to the limitation in overall size which has been placed upon semiconductor devices by the applications industry. This over-all size limitation has limited the junction area which may be provided since in accordance with the prior art techniques of forming junctions, a P–N junction within a semiconductor wafer has been formed parallel to the large surface areas of the wafer.

Accordingly it is an object of the present invention to provide a semiconductor diode which is capable of conducting exceedingly large amounts of current in the forward direction.

It is another object of the present invention to provide a semiconductor diode which is capable of exhibiting exceedingly large capacitance.

It is another object of the present invention to provide a semiconductor diode which has a junction area which is greater than heretofore possible in the prior art without increasing the over-all size of the device.

The present invention both as to its organization and operation as well as additional objects and advantages thereof will become apparent from a consideration of the following description taken in conjunction with the accompanying drawing, which is presented by way of example only and is not intended as a limitation upon the scope thereof, and in which.

A semiconductor diode in accordance with the present invention and which is capable of carrying large amounts of current in its forward biased direction and which is capable of exhibiting large capacitance, includes a body of essentially single crystal semiconductor material having a plurality of contiguous layers of alternating conductivity types therein with a P–N junction between adjacent layers. Each of the layers of like conductivity type is electrically interconnected to provide large junction areas.

In accordance with one specific embodiment of the present invention a semiconductor diode includes a wafer of essentially single crystalline semiconductor material having first and second major faces. A plurality of P–N junctions are disposed within the wafer and substantially perpendicular to the major faces. That portion of the wafer immediately beneath the first face is of one conductivity type, while that area of the wafer which is immediately beneath the second major face is of the opposite conductivity type. Electrical connections are provided to each of the major faces thereby providing a diode having a junction area which is larger than the area of either of the major faces of the semiconductor wafer.

Figure 1:
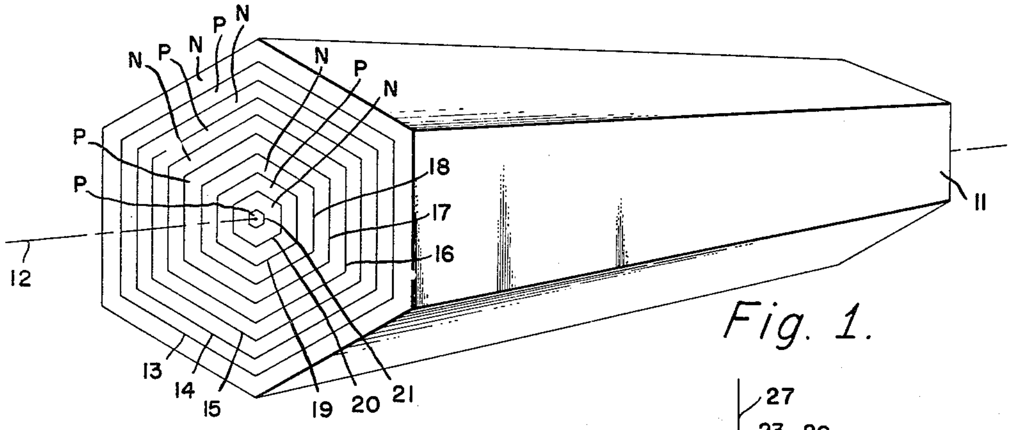
FIG. 1 is a semiconductor crystal from which semiconductor wafers may be cut in order to form semiconductor diodes in accordance with the present invention.

Referring now to the drawing and more particularly to FIG. 1 thereof, there is illustrated a crystal 11 of semiconductor material, which is essentially single crystalline in form and which has a central axis 12. Disposed about the central axis 12 of the semiconductor crystal 11 are a plurality of layers of semiconductor material of alternating conductivity type. For example, the center portion of the crystal, through which the axis 12 passes, may be P-type semiconductor material and the layer immediately adjacent thereto may be of N-type. The additional layers progressing from the axis 12 toward the outer surface of the crystal 11 would under this condition alternate P–N, P–N, and the like, until the surface of the crystal is reached. As is illustrated on the drawing each of the layers of the semiconductor material is separated from its adjacent layer by a P–N junction. Each of the P–N junctions is indicated by the numerals 13 through 21 in FIG. 1. As is illustrated in FIG. 1 each of the P–N junctions is disposed polygonally about the central axis 12. It should also be further observed that at any given point each P–N junction is parallel to every other P–N junction within the body of the crystal 11.

An essentially single crystalline semiconductor body, such as illustrated in FIG. 1, may be formed in accordance with the teachings of patent application Serial No. 27,938, filed May 9, 1960, by John E. Allegretti and James Lago, which is assigned to the assignee of the present application, now abandoned. As is disclosed in the Allegretti et al. application, semiconductor material is deposited upon a heated essentially single crystal semiconductor starting element from a decomposable source thereof in a reaction chamber. After a predetermined period of time during which the desired thickness of semiconductor material has been deposited, the reaction chamber is flushed with a gas to remove unwanted atoms of active impurity therefrom. Thereafter additional semiconductor decomposable source material and atoms of active impurity of a desired type are introduced into the reaction chamber and an additional layer of desired thickness of semiconductor material is deposited in essentially single crystalline form contiguous with the layer of material previously deposited. Each of the two layers are separated by a P–N junction. This process may be continued until such a time as the desired numbers of layers of semiconductor material of alternating conductivity type, each having a junction separating it from the adjacent layer, are formed. As is evident in the Allegretti et al. application, any desired number of layers of material, and any desired number of P–N junctions, may be formed in accordance with any given design considerations.

It should, therefore, be expressly understood that although only nine P–N junctions are illustrated within the crystal 11, as shown in FIG. 1, that the number of junctions may vary in accordance with the desired design considerations present for a device which is to be formed from the crystal 11.

Although semiconductor diodes in accordance with the present invention may be constructed from any essentially single crystalline semiconductor material, or combinations of semiconductor materials, for example, such as germanium, silicon, germanium-silicon alloy, silicon carbide, Group III—V intermetallic compounds, such as gallium-arsenide, indium-phosphide, aluminum-antimonide, indium-antimonide, and the like, for purposes of description only the following discussion of the semiconductor diodes of the present invention will be given with particular reference to the use of silicon as the semiconductor material.

Figure 2:
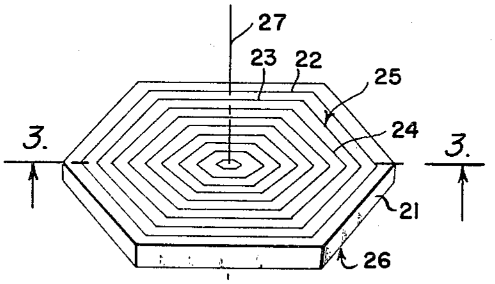
FIG. 2 is a semiconductor wafer taken from the crystal of FIG. 1.

Referring now more particularly to FIG. 2 there is illustrated a wafer 21 of essentially single crystalline silicon which has been cut from the crystal 11 as illustrated in FIG. 1. As is evident from the illustration of FIG. 2 the wafer 21 was sliced perpendicular to the axis 12 of the crystal 11, illustrated in FIG. 1. The wafer 21 of silicon semiconductor material contains the layers of alternating P and N type semiconductor material present in the initially formed crystal of semiconductor material as above described. Each of the layers of semiconductor material are separated by P–N junctions such as illustrated at 22 through 24. For purposes of clarity of description and illustration the remaining junctions of FIG. 2 are not numbered. The wafer 21 has a first major surface 25 and a second major surface 26 disposed parallel thereto and opposite therefrom. Wafer 21 has a central axis 27 about which each of the P–N junctions is polygonally disposed.

Figure 3:
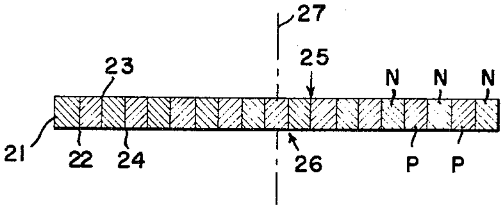
FIG. 3 is a cross-sectional view of the semiconductor wafer of FIG. 2 taken about the lines 3—3.

Referring now more particularly to FIG. 3 the semiconductor wafer 21, as illustrated in FIG. 2, is shown in cross-section as taken about the lines 3—3 of FIG. 2. As is more clearly illustrated in FIG. 3, each of the P–N junctions, for example as illustrated at 22, 23 and 24, is disposed parallel to the axis 27 of the wafer 21. As should also be noted each of the junctions is disposed perpendicular to the first and second major faces 25 and 26, respectively, of the wafer 21 to form a semiconductor diode which is capable of passing large amounts of current in the forward direction or of exhibiting large capacitance. Each of the like conductivity type areas are electrically interconnected to form a completed device and the structure is then encapsulated.

Figure 4:
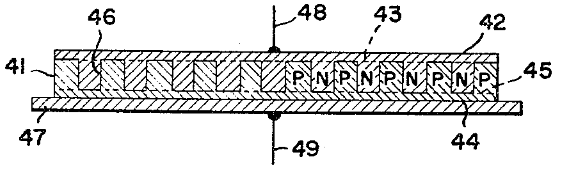
FIG. 4 is a cross-sectional view of one embodiment of a semiconductor diode in accordance with the present invention and which is produced from the structure of FIG. 2 by carrying out additional steps thereon.

The ohmic connections to each of the like conductivity areas of the wafer may be provided in the manner as illustrated in FIG. 4. As is therein shown a wafer 41, having first and second major faces, 42 and 44 respectively, and a series of P–N junctions therein similar to that illustrated in FIG. 3 and above described, is provided. A donor type impurity is diffused into the major surface 42 to a depth, for example of 1 micron, as illustrated by the dashed line 43 to thereby form an N-type layer immediately beneath the major surface 42 of the wafer 41. This may be accomplished by diffusing a phosphorus-containing compound, for example, at an elevated temperature into the surface 42 of the wafer 41. Since the entire area between the surface 42 and the dashed line 43 is converted to N-type conductivity, contact is made to each of the N-type layers of semiconductor material present within the wafer 41 and disposed perpendicular to the major surfaces 42 and 44. Into the opposite surface 44 of the wafer 41 a P-type conductivity determining active impurity is diffused, for example, a boron-containing compound may be diffused into the surface at a relatively high temperature to a depth for example of 1 micron as illustrated by the dashed line 45. There is thereby formed a region between the surface 44 and the dashed line 45 of P-type semiconductor material. This P-type semiconductor material makes contact with each of the P-type regions within the silicon wafer 41 which are interposed between the N-type layers as above described. Each of the continuous layers about the surface of the wafer, while forming contact with one of the like conductivity areas within the crystal, forms a rectifying barrier with the opposite conductivity type area. The resulting structure electrically provides a continuous P–N junction the major portion of which extends perpendicular to the major surfaces but which has interconnecting links provided by the converted surface regions of the semiconductor body.

Although the contact to each of the like conductivity areas has been above described with respect to the diffusion of an active impurity into each of the surfaces of the body, it should also be expressly understood that this contact may be provided by alloying a predetermined type of conductivity determining active impurity into each of the surfaces in order to provide a structure similar to that illustrated in FIG. 4, for example, a gold-antimony alloy may be placed upon and alloyed into surface 42 of the crystal, while an aluminum material may be placed upon and alloyed into the surface 44 of the crystal.

The wafer 41 may be placed upon a heat sink 47 which is constructed of any desired material that is capable of rapidly conducting heat away from the semiconductor wafer 41. Care should be taken to provide a material which has a coefficient of thermal contraction and expansion which is similar to that of the material from which the semiconductor wafer 41 is constructed. Electrical leads 48 and 49 are then attached, in any manner well known to the prior art, to the semiconductor wafer 41 and to the heat sink 47 and the combination is then encapsulated in accordance with techniques well known to the prior art.

A device of the type illustrated in FIG. 4 is capable of conducting large amounts of current in the forward biased direction, while at the same time retaining a relatively small size as compared to prior art semiconductor rectifiers. For example, a wafer of silicon semiconductor material having a thickness of 0.5 millimeter and a width of 4 millimeters measured from the center of one of the flat polygonal faces to the opposite flat polygonal face and containing approximately 100 P–N junctions is capable of conducting 942 amperes of current in the forward biased direction. Furthermore, a device of the above dimensions in which the donor impurity concentration is $10^{16}$ per cc. and the acceptor impurity concentration is $10^{16}$ per cee. has a capacitance at 10 volts reverse bias of 50,000 micro-microfarads.

Figure 5:
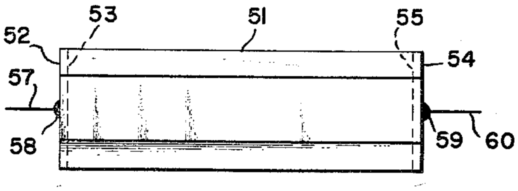
FIG. 5 is a side elevational view of another embodiment of a semiconductor diode in accordance with the present invention.

The capacitance which a semiconductor diode in accordance with the present invention may exhibit may be controlled by increasing the junction area thereof. Such a device is illustrated in FIG. 5 to which reference is hereby made. As is therein shown a semiconductor crystal 51, constructed similar to that of FIG. 1 above described, has end surfaces 52 and 54 and has P–N junctions disposed polygonally about a longitudinal axis thereof, as above described. A predetermined conductivity determining active impurity is disposed upon and introduced into the surface 52 of the crystal 51 to a depth as illustrated by the dashed line 53, while the opposite conductivity type determining active impurity is disposed upon and introduced into the opposite surface 54 to a depth as illustrated by the dashed line 55. As above described these active impurities convert the surface portions of the crystal 51 to a conductivity type which provides an ohmic connection to all layers of like conductivity type. An electrical connection is made by way of lead 60 and ohmic contact 59 to the opposite surface 54 of the crystal. A crystal of the type illustrated in FIG. 5 designed to have a peak-inverse-voltage of 40 to 50 volts and having a length of 1 centimeter and a width of .5 centimeter and having 10 P–N junctions formed therein exhibits 50,000 micro-microfarads capacitance when reverse biased at 10 volts.

There has thus been disclosed a semiconductor diode which is capable of exhibiting a large capacitance and which is capable of conducting large amounts of current in the forward biased direction.

It will be appreciated that the foregoing description of this invention is detailed for the purposes of illustration but that the invention should not be considered limited to such detail and the scope of the invention should be construed only in accordance with the appended claims.

We claim:

1. A solid state semiconductor diode comprising a disc-shaped monocrystal wafer having two planar side layers substantially perpendicular to the center axis of the wafer, a series of radially spaced circumferential layers of alternate N-type and P-type conductivity material between the side layers and extending in the axial direction of the wafer forming a plurality of radially spaced circumferential P–N junctions disposed in parallelism to the axis of the wafer, said circumferential layers terminating in the side layers respectively and forming the edges of the circumferential P–N junctions contiguously adjacent both respective side layers and within the wafer, the first of said side layers consisting of P-type conductivity material covering the edges of the alternate P-type and N-type circumferential layers in the first side layer and ohmically interconnecting the edges of the P-type layers in the first side layer and forming first radial-plane P–N junctions with the edges of the N–type layers in the first side layer, said first radial-plane P–N junctions connecting the edges of the adjacent circumferential P–N junctions in the said first side layer and forming continuous P–N junctions therewith, the second of said side layers consisting of N-type conductivity material and covering the edges of said alternate P-type and N-type circumferential layers in the second side layer and ohmically interconnecting the edges of the N-type layers in the second side layer and forming second radial-plane P–N junctions with the edges of the P–type layers in the second side layer, said second radial-plane P–N junctions connecting the edges of the adjacent circumferential P–N junctions in the second side layer and forming continuous P–N junctions therewith, whereby said first and second radial-plane junctions together with the circumferential P–N junctions form a single P–N junction extending through said disc-shaped monocrystal wafer.

2. A solid state semiconductor diode as recited in claim 1 comprising an electrode ohmically attached to each of said planar side layers.

3. A solid state semiconductor diode as set forth in claim 1 in which the peripheries of the radially spaced circumferential P–N junctions are polyhedral in form on planes perpendicular to the center axis of the wafer.

References Cited by the Examiner

UNITED STATES PATENTS

| | | | |
|---|---|---|---|
| 2,790,037 | 4/57 | Shockley | 317—235 X |
| 2,875,505 | 3/59 | Pfann | 317—235 X |
| 2,924,760 | 2/60 | Herlet | 317—235 |
| 2,929,750 | 3/60 | Strull et al. | 317—235 X |
| 2,930,950 | 3/60 | Teszner | 317—235 |
| 2,959,681 | 11/60 | Noyce | 317—235 X |
| 2,980,810 | 4/61 | Goldey | 317—235 X |
| 3,094,633 | 6/63 | Harries | 317—235 X |

DAVID J. GALVIN, *Primary Examiner.*

SAMUEL BERNSTEIN, JAMES D. KALLAM, GEORGE N. WESTBY, *Examiners.*